(12) United States Patent
Masuda

(10) Patent No.: US 11,315,726 B2
(45) Date of Patent: Apr. 26, 2022

(54) LC RESONATOR

(71) Applicant: Murata Manufacturing Co., Ltd., Nagaokakyo (JP)

(72) Inventor: Hiroshi Masuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 537 days.

(21) Appl. No.: 16/508,336

(22) Filed: Jul. 11, 2019

(65) Prior Publication Data

US 2019/0333691 A1    Oct. 31, 2019

Related U.S. Application Data

(63) Continuation of application No. PCT/JP2017/035564, filed on Sep. 29, 2017.

(30) Foreign Application Priority Data

Jan. 31, 2017   (JP) .............................. JP2017-015429

(51) Int. Cl.
*H01F 27/40* (2006.01)
*H01G 4/40* (2006.01)
*H03H 7/00* (2006.01)

(52) U.S. Cl.
CPC ............ *H01F 27/40* (2013.01); *H01G 4/40* (2013.01); *H03H 7/00* (2013.01)

(58) Field of Classification Search
CPC .. H03H 7/0115; H03H 7/1775; H03H 7/1766; H03H 7/00; H03H 2001/0085; H01G 4/40; H01F 17/0013; H01F 27/40; H01F 2017/0026

USPC ......................................................... 361/270
See application file for complete search history.

(56) References Cited

U.S. PATENT DOCUMENTS

| 6,593,841 | B1 | 7/2003 | Mizoguchi et al. |
| 2004/0164835 | A1 | 8/2004 | Shoji |
| 2014/0077895 | A1 | 3/2014 | Imamura |
| 2014/0145798 | A1* | 5/2014 | Masuda ............... H03H 7/0115 333/185 |

(Continued)

FOREIGN PATENT DOCUMENTS

| GB | 2461443 B | 6/2012 |
| JP | 2001-102235 A | 4/2001 |

(Continued)

OTHER PUBLICATIONS

Official Communication issued in International Patent Application No. PCT/JP2017/035564, dated Nov. 21, 2017.

*Primary Examiner* — Kevin J Comber
(74) *Attorney, Agent, or Firm* — Keating & Bennett, LLP

(57) ABSTRACT

An LC resonator includes an external connection terminal, an inductor, a capacitor, and a via conductor pattern. The inductor winds around an axis orthogonal to a laminated direction. The capacitor is connected to the inductor. The via conductor pattern extends from the inductor in the laminated direction, and the inductor is connected to the external connection terminal with the via conductor pattern. The inductor includes a columnar conductor pattern extending in the X-axis direction. The area of the columnar conductor pattern in a plan view from the X-axis direction is greater than or equal to the area of the via conductor pattern in a plan view from the Z-axis direction.

20 Claims, 7 Drawing Sheets

(56) References Cited

U.S. PATENT DOCUMENTS

2015/0061791 A1    3/2015  Imamura
2015/0381138 A1*  12/2015  Tamura ................ H03H 7/0115
                                                         333/185

FOREIGN PATENT DOCUMENTS

| JP | 2001144566 A | * | 5/2001 |
| JP | 2003-059722 A | | 2/2003 |
| JP | 2004-253684 A | | 9/2004 |
| JP | 2014-057277 A | | 3/2014 |
| JP | 2015-046788 A | | 3/2015 |
| WO | 2008/133018 A1 | | 11/2008 |

* cited by examiner

LC RESONATOR

CROSS REFERENCE TO RELATED APPLICATIONS

This application claims the benefit of priority to Japanese Patent Application No. 2017-015429 filed on Jan. 31, 2017 and is a Continuation Application of PCT Application No. PCT/JP2017/035564 filed on Sep. 29, 2017. The entire contents of each application are hereby incorporated herein by reference.

BACKGROUND OF THE INVENTION

1. Field of the Invention

The present invention relates to an LC resonator including multiple dielectric layers laminated in a laminated direction.

2. Description of the Related Art

LC resonators have hitherto been known which include inductors that are formed so as to wind around axes orthogonal to the laminated direction. For example, Japanese Unexamined Patent Application Publication No. 2014-57277 discloses an LC resonator including an inductor that includes two via conductor patterns extending in the laminated direction and a line conductor pattern with which the two via conductor patterns are connected to each other.

In recent years, reduction in size and low profile are requested in mobile wireless communication devices, such as smartphones, for example. The reduction in size and the low profile are also required in the LC resonators used in such devices.

Lowering the profile in the laminated direction of the LC resonator including multiple dielectric layers laminated in the laminated direction decreases the lengths of the via conductor patterns penetrating through the multiple dielectric layers in the laminated direction. Accordingly, lowering the profile of the LC resonator including the inductor that is formed so as to wind around an axis orthogonal to the laminated direction, such as the one disclosed in Japanese Unexamined Patent Application Publication No. 2014-57277, shortens the via conductor patterns included in the inductor.

When the via conductor patterns and the line conductor pattern are arranged so as to form a loop around an axis, as in the inductor disclosed in Japanese Unexamined Patent Application Publication No. 2014-57277, shortening the via conductor patterns increases the ratio of the length of the line conductor pattern to the loop length of the inductor. Since the shape of the line conductor pattern (plate shape) having a small width (thickness) in the laminated direction, such as the one disclosed in Japanese Unexamined Patent Application Publication No. 2014-57277, has a small cross-sectional area orthogonal to a longitudinal direction (a small cross-sectional area), compared with the cross-sectional areas of the columnar via conductor patterns, the current density tends to increase. Accordingly, increasing the ratio of the length of the line conductor pattern to the loop length of the inductor increases the current density of the inductor. Increasing the current density of the inductor increases the ratio of signals lost in the LC resonator to signals input into the LC resonator. In other words, the insertion loss in the LC resonator is increased to reduce the Q value.

SUMMARY OF THE INVENTION

Preferred embodiments of the present invention reduce or prevent the reduction of the Q value of LC resonators associated with the low profile of the LC resonators.

An LC resonator according to a preferred embodiment of the present invention includes a multilayer body in which multiple dielectric layers are laminated in a laminated direction. The LC resonator includes an external connection terminal, an inductor, a capacitor, and a via conductor pattern. The inductor winds around an axis orthogonal or substantially orthogonal to the laminated direction. The capacitor is connected to the inductor. The via conductor pattern extends from the inductor in the laminated direction, and the inductor is connected to the external connection terminal with the via conductor pattern. The inductor includes a first columnar conductor pattern extending in a first direction orthogonal or substantially orthogonal to the laminated direction. The area of the first columnar conductor pattern in a plan view from the first direction is greater than or equal to the area of the via conductor pattern in a plan view from the laminated direction.

In LC resonators according to preferred embodiments of the present invention, the area of the first columnar conductor pattern in a plan view from the first direction is greater than or equal to the area of the via conductor pattern in a plan view from the laminated direction. The current density of the first columnar conductor pattern is lower than or equal to the current density of the via conductor pattern. Accordingly, an increase in the current density of the inductor is reduced or prevented even when the profile of the LC resonator is lowered. As a result, an increase in the insertion loss of the LC resonator associated with the low profile is reduced or prevented to enable the reduction of the Q value of the LC resonator to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
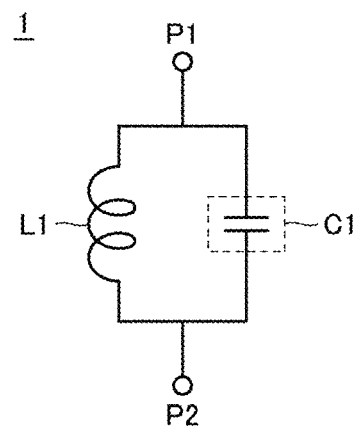
FIG. 1 is an equivalent circuit diagram of an LC resonator according to a first preferred embodiment of the present invention.

Preferred embodiments of the present invention will herein be described in detail with reference to the drawings. The same reference numerals are used in the drawings to identify the same components or corresponding components. A description of such components is not repeated as a general rule.

First Preferred Embodiment

FIG. 1 is an equivalent circuit diagram of an LC resonator 1 according to a first preferred embodiment of the present invention. As illustrated in FIG. 1, the LC resonator 1 includes external connection terminals P1 and P2, an inductor L1, and a capacitor C1. The inductor L1 is connected in parallel to the capacitor C1 between the external connection terminals P1 and P2. The equivalent circuit diagrams of LC resonators according to a first comparative example and a second comparative example and according to second to fourth preferred embodiments described after the first preferred embodiment are the same or substantially the same as the equivalent circuit diagram illustrated in FIG. 1.

Figure 2:
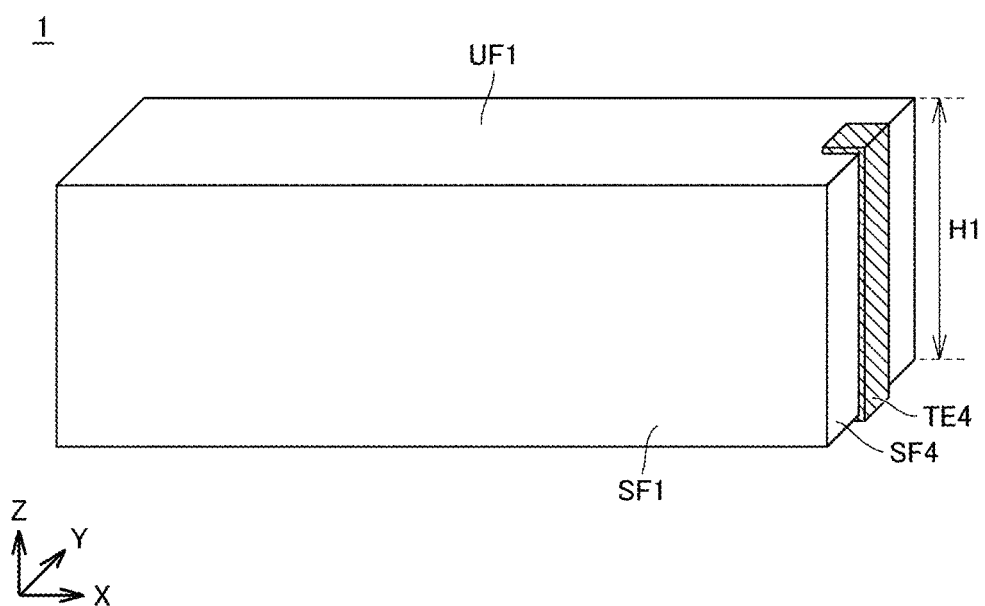
FIG. 2 is an external perspective view of the LC resonator in FIG. 1.
Figure 3:
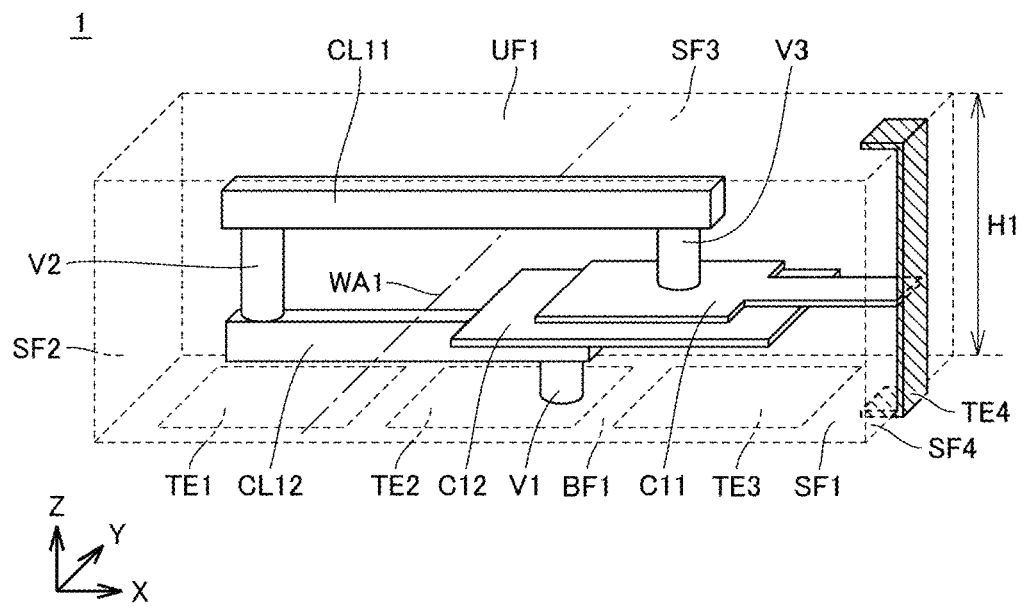
FIG. 3 is an external transparent perspective view of the LC resonator in FIG. 1.

FIG. 2 is an external perspective view of the LC resonator 1. FIG. 3 is an external transparent perspective view of the LC resonator 1. The LC resonator 1 includes a multilayer body in which multiple dielectric layers are laminated in the Z-axis direction (a laminated direction). Referring to FIG. 2 and FIG. 3, the X-axis direction, the Y-axis direction, and the Z-axis direction are orthogonal or substantially orthogonal to each other. The same applies to FIG. 4 to FIG. 12.

As illustrated in FIG. 2 and FIG. 3, the LC resonator 1 is preferably, for example, a rectangular or substantially rectangular parallelepiped. Surfaces of the outermost layer of the LC resonator 1, which are perpendicular or substantially perpendicular to the laminated direction of the multiple dielectric layers, are referred to as a bottom surface BF1 and an upper surface UF1. Among the surfaces parallel or substantially parallel to the laminated direction of the multiple dielectric layers, surfaces parallel or substantially parallel to the Z-X plane are referred to as side surfaces SF1 and SF3. Among the surfaces parallel or substantially parallel to the laminated direction of the multiple dielectric layers, surfaces parallel or substantially parallel to the Y-Z plane are referred to as side surfaces SF2 and SF4. The thickness of the LC resonator 1 is denoted by H1.

Terminal electrodes TE1 to TE3 are provided on the bottom surface BF1. The terminal electrodes TE1 to TE3 are preferably, for example, land grid array (LGA) terminals on which plane electrodes are regularly or uniformly arranged. The bottom surface BF1 is connected to a circuit board (not illustrated). A terminal electrode TE4 is disposed over the upper surface UF1, the side surface SF4, and the bottom surface BF1. In the first preferred embodiment, the terminal electrodes TE4 and TE2 correspond to the external connection terminals P1 and P2, respectively, in FIG. 1.

As illustrated in FIG. 3, columnar conductor patterns CL11 and CL12 having quadrangular or substantially quadrangular prism shapes, cylindrical via conductor patterns V1 to V3, and plate-shaped capacitor conductor patterns C11 and C12 are provided inside the multiple dielectric layers.

Each of the columnar conductor patterns CL11 and CL12 extends in the X-axis direction. The columnar conductor patterns CL11 and CL12 are preferably, for example, conductor patterns resulting from thermosetting of conductor paste filled in cavities provided in a ceramic sheet with a laser or a dicer using screen printing or a dispenser. Alternatively, after the columnar conductor patterns CL11 and CL12 are provided on the ceramic sheet, ceramic paste may be applied to flatten the difference in level between the ceramic sheet and the columnar conductor patterns CL11 and CL12.

The via conductor pattern V1 extends in the Z-axis direction and the columnar conductor pattern CL12 is connected to the terminal electrode TE2 with the via conductor pattern V1. The via conductor pattern V2 extends in the Z-axis direction and the columnar conductor patterns CL11 and CL12 are connected to each other with the via conductor pattern V2. The via conductor pattern V3 extends in the Z-axis direction and the columnar conductor pattern CL11 is connected to the capacitor conductor pattern C11 with the via conductor pattern V3.

The capacitor conductor pattern C11 is connected to the terminal electrode TE4. The capacitor conductor pattern C12 is connected to the columnar conductor pattern CL12. The capacitor conductor pattern C12 may be connected to the columnar conductor pattern CL12 by a via conductor pattern.

The via conductor pattern V3, the columnar conductor pattern CL11, the via conductor pattern V2, and the columnar conductor pattern CL12 wind around an axis WA1 to define the inductor L1. The capacitor conductor patterns C11 and C12 are opposed to each other in the laminated direction to define the capacitor C1.

Figure 4:
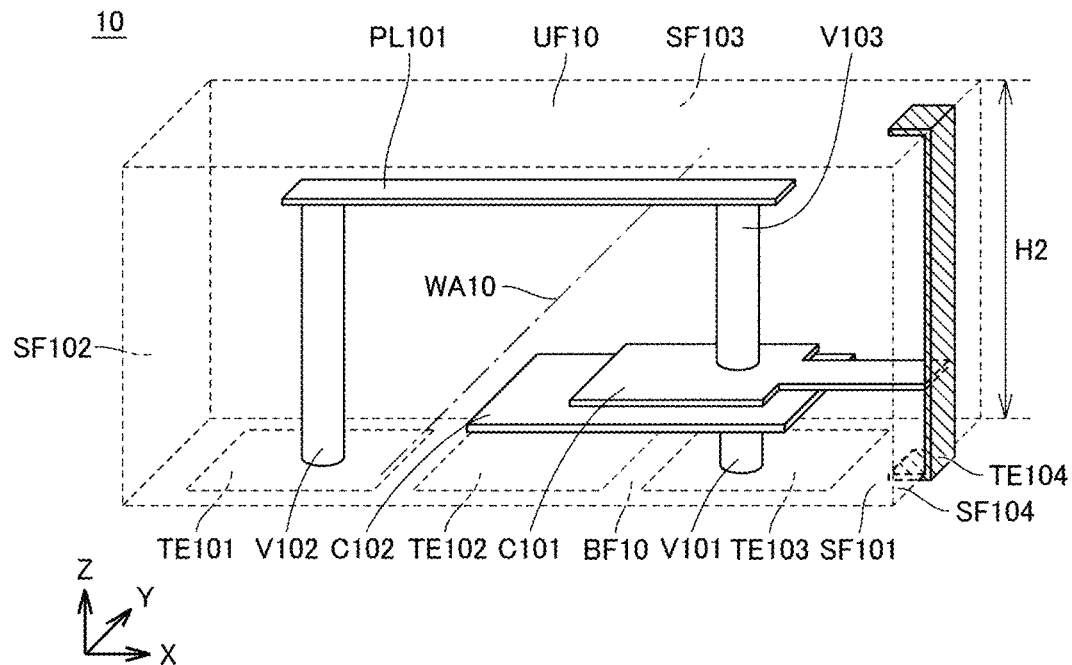
FIG. 4 is an external transparent perspective view of an LC resonator according to a first comparative example.

FIG. 4 is an external transparent perspective view of an LC resonator 10 according to a first comparative example. As illustrated in FIG. 4, the LC resonator 10 includes a multilayer body including multiple dielectric layers and is preferably, for example, a rectangular or substantially rectangular parallelepiped. Surfaces of the outermost layer of the LC resonator 10, which are perpendicular or substantially perpendicular to the laminated direction of the multiple dielectric layers, are referred to as a bottom surface BF10 and an upper surface UF10. Among the surfaces parallel or substantially parallel to the laminated direction of the multiple dielectric layers, surfaces parallel or substantially parallel to the Z-X plane are referred to as side surfaces SF101 and SF103. Among the surfaces parallel or substantially parallel to the laminated direction of the multiple dielectric layers, surfaces parallel or substantially parallel to the Y-Z plane are referred to as side surfaces SF102 and SF104. The thickness of the LC resonator 10 is denoted by H2 (>H1).

Terminal electrodes TE101 to TE103 are provided on the bottom surface BF10. The terminal electrodes TE101 to TE103 are preferably, for example, land grid array (LGA) terminals on which plane electrodes are regularly or uniformly arranged. The bottom surface BF10 is connected to a circuit board (not illustrated). A terminal electrode TE104 is disposed over the upper surface UF10, the side surface SF104, and the bottom surface BF10. In the first comparative example, the terminal electrode TE104 corresponds to the external connection terminal P1 and the terminal electrodes TE101 and TE103 correspond to the external connection terminal P2.

A line conductor pattern PL101, via conductor patterns V101 to V103, and capacitor conductor patterns C101 and C102 are provided inside the multiple dielectric layers.

The line conductor pattern PL101 extends in the X-axis direction. The line conductor pattern PL101 has a plate shape. The thickness of the line conductor pattern PL101 is the same as or similar to the thickness of the capacitor conductor pattern C101. The thickness of the line conductor pattern PL101 is smaller than that of the columnar conductor pattern CL11 illustrated in FIG. 3. The length in the Y-axis direction of the line conductor pattern PL101 is the same as or similar to the length in the Y-axis direction of the columnar conductor pattern CL11 illustrated in FIG. 3.

Referring back to FIG. 4, the via conductor pattern V101 extends in the Z-axis direction and the capacitor conductor pattern C102 is connected to the terminal electrode TE103 with the via conductor pattern V101. The via conductor pattern V102 extends in the Z-axis direction and the line conductor pattern PL101 is connected to the terminal electrode TE101 with the via conductor pattern V102. The via conductor pattern V103 extends in the Z-axis direction and the line conductor pattern PL101 is connected to the capacitor conductor pattern C101 with the via conductor pattern V103. The capacitor conductor pattern C101 is connected to the terminal electrode TE104.

The via conductor pattern V102, the line conductor pattern PL101, and the via conductor pattern V103 wind around an axis WA10 to define the inductor L1. The capacitor conductor patterns C101 and C102 are opposed to each other in the Z-axis direction to define the capacitor C1.

Figure 5:
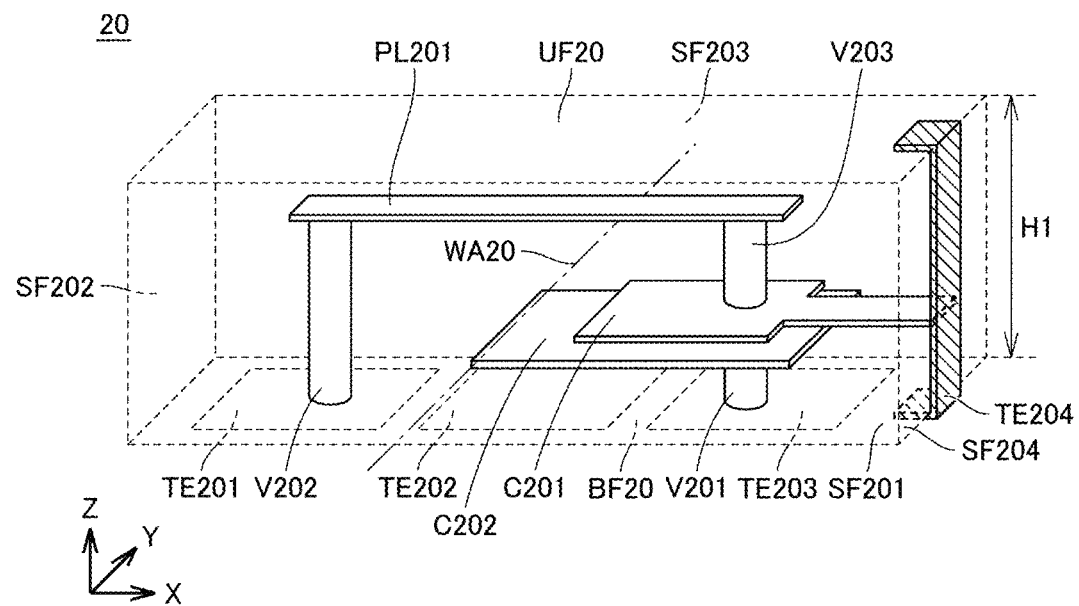
FIG. 5 is an external transparent perspective view of an LC resonator according to a second comparative example.

FIG. 5 is an external transparent perspective view of an LC resonator 20 according to a second comparative example. As illustrated in FIG. 5, the LC resonator 20 includes a multilayer body including multiple dielectric layers and is a rectangular or substantially rectangular parallelepiped. Surfaces of the outermost layer of the LC resonator 20, which are perpendicular or substantially perpendicular to the laminated direction of the multiple dielectric layers, are referred to as a bottom surface BF20 and an upper surface UF20. Among the surfaces parallel or substantially parallel to the laminated direction of the multiple dielectric layers, surfaces parallel or substantially parallel to the Z-X plane are referred to as side surfaces SF201 and SF203. Among the surfaces parallel or substantially parallel to the laminated direction of the multiple dielectric layers, surfaces parallel or substantially parallel to the Y-Z plane are referred to as side surfaces SF202 and SF204. The thickness of the LC resonator 20 is denoted by H1 (<H2). The LC resonator 20 is an LC resonator resulting from lowering the profile of the LC resonator 10 illustrated in FIG. 4 in the laminated direction.

Terminal electrodes TE201 to TE203 are provided on the bottom surface BF20. The terminal electrodes TE201 to TE203 are preferably, for example, land grid array (LGA) terminals on which plane electrodes are regularly or uniformly arranged. The bottom surface BF20 is connected to a circuit board (not illustrated). A terminal electrode TE204 is disposed over the upper surface UF20, the side surface SF204, and the bottom surface BF20. In the second comparative example, the terminal electrode TE204 corresponds to the external connection terminal P1 and the terminal electrodes TE201 and TE203 correspond to the external connection terminal P2.

A line conductor pattern PL201, via conductor patterns V201 to V203, and capacitor conductor patterns C201 and C202 are provided inside the multiple dielectric layers. The line conductor pattern PL201, the capacitor conductor patterns C201 and C202, and the via conductor pattern V201 have shapes the same as or similar to those of the line conductor pattern PL101, the capacitor conductor patterns C101 and C102, and the via conductor pattern V101, respectively, illustrated in FIG. 4. The via conductor pattern V202 illustrated in FIG. 5 is shorter than the via conductor pattern V102 illustrated in FIG. 4. The via conductor pattern V203 illustrated in FIG. 5 is shorter than the via conductor pattern V103 illustrated in FIG. 4.

Referring back to FIG. 5, the line conductor pattern PL201 extends in the X-axis direction. The via conductor pattern V201 extends in the Z-axis direction and the capacitor conductor pattern C202 is connected to the terminal electrode TE203 with the via conductor pattern V201. The via conductor pattern V202 extends in the Z-axis direction and the line conductor pattern PL201 is connected to the terminal electrode TE201 with the via conductor pattern V202. The via conductor pattern V203 extends in the Z-axis direction and the line conductor pattern PL201 is connected to the capacitor conductor pattern C201 with the via conductor pattern V203. The capacitor conductor pattern C201 is connected to the terminal electrode TE204.

The via conductor pattern V202, the line conductor pattern PL201, and the via conductor pattern V203 wind around an axis WA20 to define the inductor L1. The capacitor conductor patterns C201 and C202 are opposed to each other in the laminated direction to define the capacitor C1.

Lowering the profile of the LC resonator 10 (the thickness H2) illustrated in FIG. 4 to the profile of the LC resonator 20 (the thickness H1) illustrated in FIG. 5 shortens the via conductor patterns V102 and the V103. The ratio of the length of the line conductor pattern PL201 to the loop length of the inductor L1 in the second comparative example is higher than the ratio of the length of the line conductor pattern PL101 to the loop length of the inductor L1 in the first comparative example. Since the plate-shaped line conductor pattern PL201 has a cross section smaller than those of the cylindrical via conductor patterns V202 and V203, the current density tends to increase. Accordingly, increasing the ratio of the line conductor pattern PL201 to the inductor L1 increases the current density of the inductor L1. Increasing the current density of the inductor L1 increases the ratio of signals lost in the LC resonator 20 to signals input into the LC resonator 20. In other words, the insertion loss in the LC resonator 20 is greater than the insertion loss in the LC resonator 10 such that the Q value of the LC resonator 20 is lower than the Q value of the LC resonator 10.

Figure 6A:
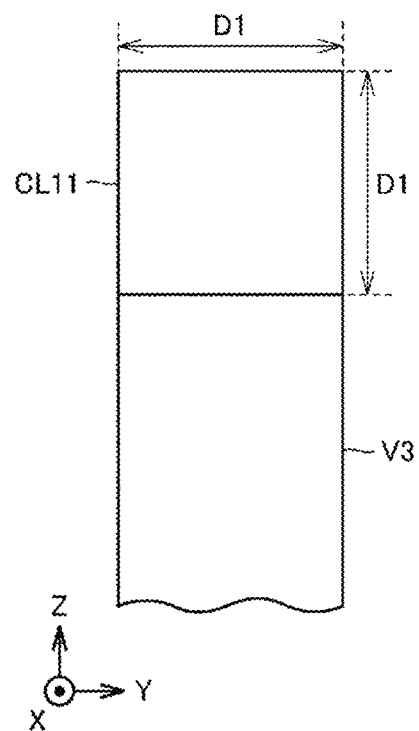
FIGS. 6A and 6B illustrate plan views of a columnar conductor pattern in FIG. 3 from the X-axis direction and a plan view of a via conductor pattern in FIG. 3 from the Z-axis direction.
Figure 6B:
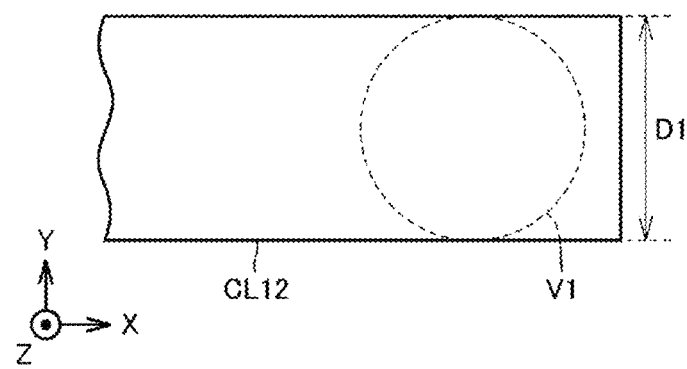

Accordingly, in the first preferred embodiment, the columnar conductor pattern having a current density lower than or equal to those of the via conductor patterns is provided, instead of the plate-shaped line conductor pattern, as one of the conductor patterns of the inductor L1. FIGS. 6A and 6B illustrate plan views of the columnar conductor pattern CL11 in FIG. 3 from the X-axis direction and a plan view of the via conductor pattern V1 in FIG. 3 from the Z-axis direction.

FIG. 6A illustrates a plan view of the columnar conductor pattern CL11 in FIG. 3 from the X-axis direction. The shape of the columnar conductor pattern CL11 in a plan view from the X-axis direction in the first preferred embodiment corresponds to the cross-sectional shape of the columnar conductor pattern CL11 on a cross section orthogonal to the longitudinal direction (the X-axis direction) of the columnar conductor pattern. The area of the shape of the columnar conductor pattern CL11 in a plan view in the X-axis direction in the first preferred embodiment is the cross sectional area of the columnar conductor pattern CL11.

As illustrated in FIG. 6A, both of the length in the Y-axis direction of the columnar conductor pattern CL11 and the length in the Z-axis direction thereof are denoted by D1. The columnar conductor pattern CL11 is a prism having a square or substantially square cross-sectional shape. The ratio of the length in the Z-axis direction of the columnar conductor pattern CL11 to the length in the Y-axis direction thereof is about one. The ratio of the length in the Z-axis direction of the columnar conductor pattern CL11 to the length in the Y-axis direction thereof may be greater than one. The area (the cross-sectional area) of the columnar conductor pattern CL11 in a plan view from the X-axis direction is denoted by $D1^2$.

FIG. 6B illustrates a plan view of the via conductor pattern V1 in FIG. 3 from the Z-axis direction. The shape of the via conductor pattern V1 in a plan view from the Z-axis direction in the first preferred embodiment corresponds to the cross-sectional shape of the via conductor pattern V1 on a cross section orthogonal or substantially orthogonal to the longitudinal direction (the Z-axis direction) of the via conductor pattern V1. The area of the shape of the via conductor pattern V1 in a plan view in the Z-axis direction in the first preferred embodiment is the cross sectional area of the via conductor pattern V1.

As illustrated in FIG. 6B, the via conductor pattern V1 is a cylinder having a cross-sectional shape of a diameter D1. The area of the via conductor pattern V1 in a plan view from the Z-axis direction is denoted by $\pi D1^2/4$. The area ($D1^2$) of the columnar conductor pattern CL11 in a plan view from the X-axis direction is greater than the area ($\pi D1^2/4$) of the via conductor pattern V1 in a plan view from the Z-axis direction. Similarly, the area of the columnar conductor pattern CL12 in a plan view from the X-axis direction is greater than the area (the cross-sectional area) of the via conductor pattern V1 in a plan view from the Z-axis direction.

The cross-sectional area of the columnar conductor pattern CL11 in the LC resonator 1 is greater than the cross-sectional area of the via conductor pattern V1. Accordingly, the current density of the columnar conductor pattern CL11 is lower than the current density of the line conductor pattern PL201 in the LC resonator 20 illustrated in FIG. 5. An increase in the insertion loss associated with the low profile is reduced or prevented in the LC resonator 1, compared with that in the LC resonator 20, to enable the reduction of the Q value to be reduced or prevented.

In addition, in the LC resonator 1, the ratio of the length in the Z-axis direction of the columnar conductor pattern CL11 to the length in the Y-axis direction thereof is about one. Compared with a case in which the ratio of the length in the Z-axis direction to the length in the Y-axis direction is smaller than one, the current is easy to flow through the columnar conductor pattern CL11. Compared with the case in which the ratio of the length in the Z-axis direction to the length in the Y-axis direction is smaller than one, the increase in the insertion loss associated with the low profile is reduced or prevented in the LC resonator 1 to enable the reduction of the Q value to be reduced or prevented.

As described above, with the LC resonator according to the first preferred embodiment, making the cross-sectional areas of the columnar conductor patterns greater than the cross-sectional area of the via conductor pattern enables the reduction of the Q value of the LC resonator to be reduced or prevented.

In addition, in the first preferred embodiment, setting the ratio of the length in the Z-axis direction of the columnar conductor pattern to the length in the Y-axis direction thereof to one or more enables the reduction of the Q value of the LC resonator associated with the low profile to be further reduced or prevented.

The case is described in the first preferred embodiment in which the columnar conductor pattern is provided, instead of the plate-shaped line conductor pattern, as one of the conductor patterns defining the inductor in order to reduce or prevent the reduction of the Q value associated with the low profile. The columnar conductor pattern having a thickness greater than that of the line conductor pattern has an inductance smaller than that of the line conductor pattern. Accordingly, the use of the columnar conductor pattern, instead of the plate-shaped line conductor pattern, as one of the conductor patterns defining the inductor may make the inductance of the inductor smaller than a desired value. In order to avoid this, cases will be described in the second to fourth preferred embodiments in which the areas of portions (cavity portions) surrounded by the conductor patterns are increased by lengthening the total lengths of the conductor patterns winding around axes (the loop length of the inductor) to increase the inductance of the inductor.

In the second and third preferred embodiments, cases will be described in which the columnar conductor patterns are lengthened. In the fourth preferred embodiment, a case will be described in which the distance in the laminated direction between two columnar conductor patterns is increased.

Second Preferred Embodiment

Figure 7:
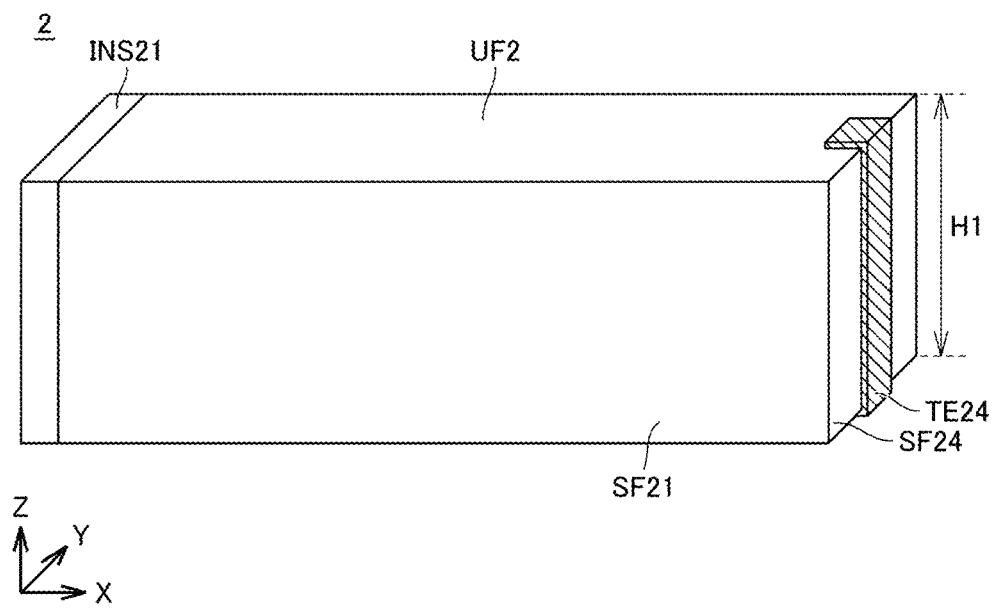
FIG. 7 is an external perspective view of an LC resonator according to a second preferred embodiment of the present invention.
Figure 8:
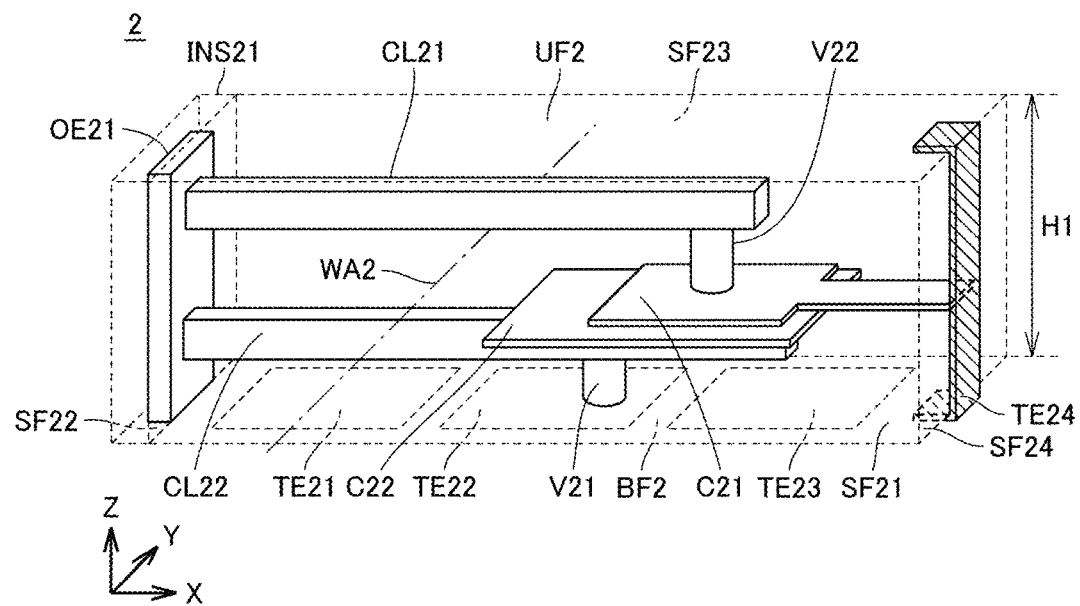
FIG. 8 is an external transparent perspective view of the LC resonator in FIG. 7.

FIG. 7 is an external perspective view of an LC resonator according to the second preferred embodiment of the present invention. FIG. 8 is an external transparent perspective view of the LC resonator 2 in FIG. 7. The LC resonator 2 includes a multilayer body in which multiple dielectric layers are laminated in the Z-axis direction (the laminated direction).

As illustrated in FIG. 7 and FIG. 8, the LC resonator 2 is preferably, for example, a rectangular or substantially rectangular parallelepiped. Surfaces of the outermost layer, which are perpendicular or substantially perpendicular to the laminated direction of the multiple dielectric layers, are referred to as a bottom surface BF2 and an upper surface UF2. Among the surfaces parallel or substantially parallel to the laminated direction of the multiple dielectric layers, surfaces parallel or substantially parallel to the Z-X plane are referred to as side surfaces SF21 and SF23. Among the surfaces parallel or substantially parallel to the laminated direction of the multiple dielectric layers, surfaces parallel or substantially parallel to the Y-Z plane are referred to as side surfaces SF22 and SF24. The thickness of the LC resonator 2 is denoted by H1.

Terminal electrodes TE21 to TE23 are provided on the bottom surface BF2. The terminal electrodes TE21 to TE23 are preferably, for example, land grid array (LGA) terminals on which plane electrodes are regularly or uniformly arranged. The bottom surface BF2 is connected to a circuit board (not illustrated). A terminal electrode TE24 is disposed over the upper surface UF2, the side surface SF24, and the bottom surface BF2. In the second preferred embodiment, the terminal electrodes TE24 and TE22 correspond to the external connection terminals P1 and P2, respectively, in FIG. 1. An insulating layer INS21 containing resin is provided on the side surface SF22.

As illustrated in FIG. 8, columnar conductor patterns CL21 and CL22 having quadrangular or substantially quadrangular prism shapes, cylindrical via conductor patterns V21 and V22, and plate-shaped capacitor conductor patterns C21 and C22 are provided inside the LC resonator 2. An outer electrode OE21 is provided on the side surface SF22 outside the multiple dielectric layers. An exposed portion of the outer electrode OE21 is covered with the insulating layer INS21. The insulating layer INS21 prevents the outer electrode OE21 from being in contact with conductors outside the multiple dielectric layers.

Each of the columnar conductor patterns CL21 and CL22 extends in the X-axis direction. In a plan view from the X-axis direction, both of the length in the Y-axis direction of the columnar conductor pattern CL21 and the length in the Z-axis direction thereof are denoted by D1. The columnar conductor pattern CL21 is a prism having a square or substantially square cross-sectional shape. The same applies to the columnar conductor pattern CL22.

The via conductor pattern V21 extends in the Z-axis direction and the columnar conductor pattern CL22 is connected to the terminal electrode TE22 with the via conductor pattern V21. The via conductor pattern V21 is a cylinder having a cross-sectional shape of the diameter D1.

The area of the columnar conductor pattern CL21 in a plan view from the X-axis direction is greater than the area of the via conductor pattern V21 in a plan view from the Z-axis direction. The same applies to the columnar conductor pattern CL22 and the area of the columnar conductor pattern CL22 in a plan view from the X-axis direction is greater than the area of the via conductor pattern V21 in a plan view from the Z-axis direction.

The outer electrode OE21 extends in the Z-axis direction and the columnar conductor patterns CL21 and CL22 are connected to each other with the outer electrode OE21. The via conductor pattern V22 extends in the Z-axis direction and the columnar conductor pattern CL21 is connected to the capacitor conductor pattern C21 with the via conductor pattern V22. The capacitor conductor pattern C22 is connected to the columnar conductor pattern CL22. The capacitor conductor patterns C21 and C22 are opposed to each other in the Z-axis direction to define the capacitor C1.

The via conductor pattern V22, the columnar conductor pattern CL21, the outer electrode OE21, and the columnar conductor pattern CL22 wind around an axis WA2 to define the inductor L1.

In the second preferred embodiment, the outer electrode OE21 with which the columnar conductor patterns CL21 and CL22 are connected to each other is provided on the side surface SF22 orthogonal or substantially orthogonal to the longitudinal direction (the X-axis direction) of the columnar conductor patterns CL21 and CL22. Accordingly, the columnar conductor patterns CL21 and CL22 are capable of being extended to the side surface SF22. The columnar conductor patterns CL21 and CL22 are capable of being made longer than the columnar conductor patterns CL11 and CL12 in FIG. 3. The loop length of the inductor L1 is capable of being made longer than that in the first preferred embodiment and the area of the cavity portion of the inductor L1 is capable of being further increased. As a result, the inductance of the inductor L1 is capable of being made greater than that in the first preferred embodiment.

The case is described in the second preferred embodiment in which the connection conductor with which the columnar conductor patterns CL21 and CL22 are connected to each other is the outer electrode OE21. The entire portion of the outer electrode OE21 is provided outside the multiple dielectric layers. When there is no space in which the entire portion of the connection conductor is provided around the portion where the LC resonator 2 is mounted, a portion of the connection conductor may be provided outside the multiple dielectric layers.

As described above, with the LC resonator according to the second preferred embodiment, it is possible to reduce or prevent the reduction of the Q value associated with the low profile, as in the first preferred embodiment.

In addition, in the second preferred embodiment, providing one connection conductor with which the two columnar conductor patterns included in the inductor are connected to each other outside the multiple dielectric layers enables the area of the cavity portion of the inductor to be greater than that in the first preferred embodiment. As a result, the inductance of the inductor L1 is capable of being greater than that in the first preferred embodiment.

Third Preferred Embodiment

The case is described in the second preferred embodiment in which the outer electrode is provided on one side surface of the multiple dielectric layers, which is orthogonal or substantially orthogonal to the longitudinal direction of the columnar conductor patterns, to lengthen the columnar conductor pattern. A case will be described in the third preferred embodiment in which outer electrodes are provided on two side surfaces of the multiple dielectric layers, which are orthogonal or substantially orthogonal to the longitudinal direction of the columnar conductor patterns, to further lengthen the columnar conductor pattern.

Figure 9:
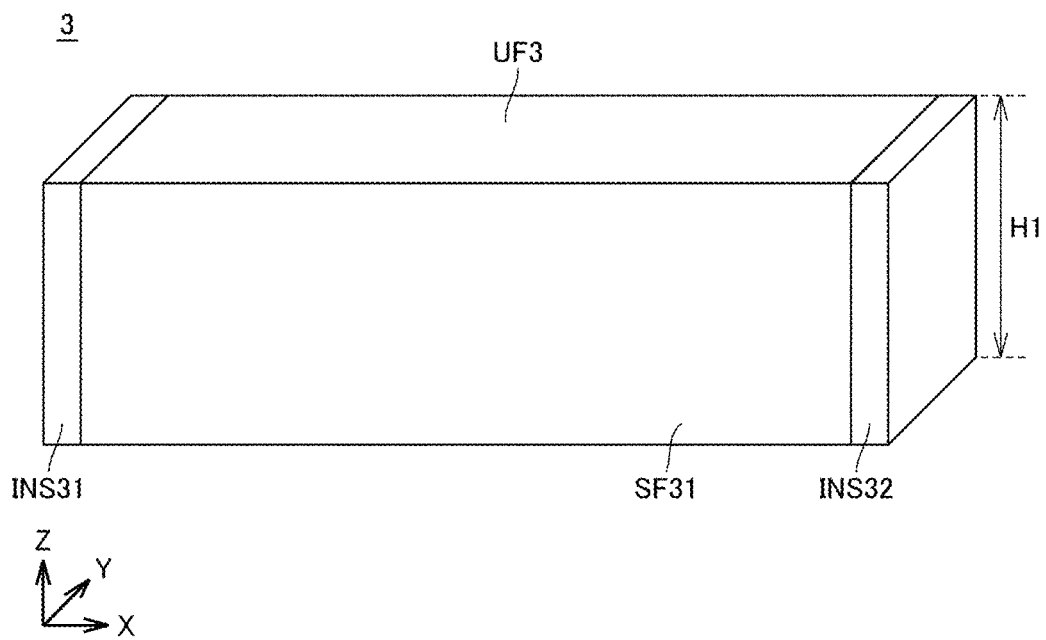
FIG. 9 is an external perspective view of an LC resonator according to a third preferred embodiment of the present invention.
Figure 10:
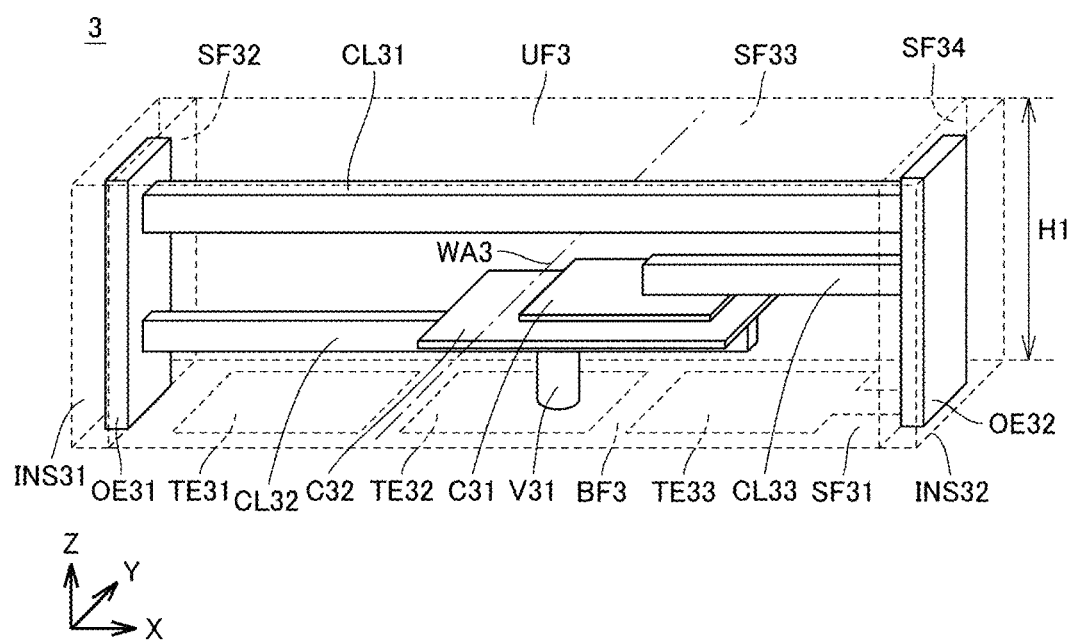
FIG. 10 is an external transparent perspective view of the LC resonator in FIG. 9.

FIG. 9 is an external perspective view of an LC resonator according to the third preferred embodiment of the present invention. FIG. 10 is an external transparent perspective view of the LC resonator 3 in FIG. 9. The LC resonator 3 is a multilayer body in which multiple dielectric layers are laminated in the Z-axis direction (the laminated direction).

As illustrated in FIG. 9 and FIG. 10, the LC resonator is preferably, for example, a rectangular or substantially rectangular parallelepiped. Surfaces of the outermost layer, which are perpendicular or substantially perpendicular to the laminated direction, are referred to as a bottom surface BF3 and an upper surface UF3. Among the surfaces parallel or substantially parallel to the laminated direction, surfaces parallel or substantially parallel to the Z-X plane are referred to as side surfaces SF31 and SF33. Among the surfaces parallel or substantially parallel to the laminated direction, surfaces parallel or substantially parallel to the Y-Z plane are referred to as side surfaces SF32 and SF34. The thickness of the LC resonator 3 is denoted by H1.

Terminal electrodes TE31 to TE33 are provided on the bottom surface BF3. The terminal electrodes TE31 to TE33 are preferably, for example, land grid array (LGA) terminals on which plane electrodes are regularly or uniformly arranged. In the third preferred embodiment, the terminal electrodes TE32 and TE33 correspond to the external connection terminals P1 and P2, respectively, in FIG. 1. An insulating layer INS31 containing resin is provided on the side surface SF32. An insulating layer INS32 containing resin is provided on the side surface SF34.

As illustrated in FIG. 10, columnar conductor patterns CL31, CL32, and CL33 having quadrangular or substantially quadrangular prism shapes, a cylindrical via conductor pattern V31, and plate-shaped capacitor conductor patterns C31 and C32 are provided inside the multiple dielectric layers.

Each of the columnar conductor patterns CL31, CL32, and CL33 extends in the X-axis direction. In a plan view from the X-axis direction, both of the length in the Y-axis direction of the columnar conductor pattern CL31 and the length in the Z-axis direction thereof are denoted by D1. The columnar conductor pattern CL31 is a prism having a square or substantially square cross-sectional shape. The same applies to the columnar conductor patterns CL32 and CL33.

The via conductor pattern V31 extends in the Z-axis direction and the columnar conductor pattern CL is connected to the terminal electrode TE32 with the via conductor pattern V31. The via conductor pattern V31 is a cylinder having a cross-sectional shape of the diameter D1.

The area of the columnar conductor pattern CL31 in a plan view from the X-axis direction is greater than the area of the via conductor pattern V31 in a plan view from the Z-axis direction. The same applies to the columnar conductor patterns CL32 and CL33.

An outer electrode OE31 is provided on the side surface SF32 outside the multiple dielectric layers. The outer electrode OE31 extends in the Z-axis direction and the columnar conductor patterns CL31 and CL32 are connected to each other with the outer electrode OE31.

An exposed portion of the outer electrode OE31 is covered with the insulating layer INS31. The insulating layer INS31 prevents the outer electrode OE31 from being in contact with conductors outside the multiple dielectric layers.

An outer electrode OE32 is provided on the side surface SF34 outside the multiple dielectric layers. The outer electrode OE32 extends in the Z-axis direction and the columnar conductor patterns CL31 and CL33 are connected to each other with the outer electrode OE32. The outer electrode OE32 is connected to the terminal electrode TE33.

An exposed portion of the outer electrode OE32 is covered with the insulating layer INS32. The insulating layer INS32 prevents the outer electrode OE32 from being in contact with conductors outside the multiple dielectric layers.

The capacitor conductor pattern C31 is connected to the columnar conductor pattern CL33. The capacitor conductor pattern C32 is connected to the columnar conductor pattern CL32. The capacitor conductor patterns C31 and C32 are opposed to each other in the Z-axis direction to define the capacitor C1.

The columnar conductor pattern CL33, the outer electrode OE32, the columnar conductor pattern CL31, the outer electrode OE31, and the columnar conductor pattern CL32 wind around an axis WA3 to define the inductor L1.

In the third preferred embodiment, the outer electrodes OE31 with which the columnar conductor patterns CL31 and CL32 are connected to each other and the outer electrodes OE32 with which the columnar conductor patterns CL31 and CL33 are connected to each other are provided on the side surfaces SF32 and SF34, respectively, orthogonal or substantially orthogonal to the longitudinal direction (the X-axis direction) of the columnar conductor patterns CL31 and CL32 and CL33. Accordingly, the columnar conductor patterns CL31 and CL32 and CL33 are capable of being extended to the side surface SF32 and the side surface SF34. The columnar conductor patterns CL31 and CL32 are capable of being made longer than the columnar conductor patterns CL21 and CL22 illustrated in FIG. 8. In the third preferred embodiment, the loop length of the inductor L1 is capable of being made longer than that in the second preferred embodiment and the area of the cavity portion of the inductor L1 is capable of being further increased. As a result, the inductance of the inductor L1 is capable of being greater than that in the second preferred embodiment.

As described above, with the LC resonator according to the third preferred embodiment, it is possible to reduce or prevent the reduction of the Q value associated with the low profile, as in the first preferred embodiment.

In addition, in the third preferred embodiment, providing the two connection conductors with which the two columnar conductor patterns included in the inductor are connected to each other outside the multiple dielectric layers enables the area of the cavity portion of the inductor to be much greater than that in the second preferred embodiment. As a result, it is possible to further increase the inductance of the inductor.

Fourth Preferred Embodiment

The cases are described in the second and third preferred embodiments in which the columnar conductor patterns are lengthened to increase the inductance of the inductor. A case will be described in the fourth preferred embodiment in which the distance in the laminated direction between two columnar conductor patterns is increased to increase the inductance of the inductor.

Figure 11:
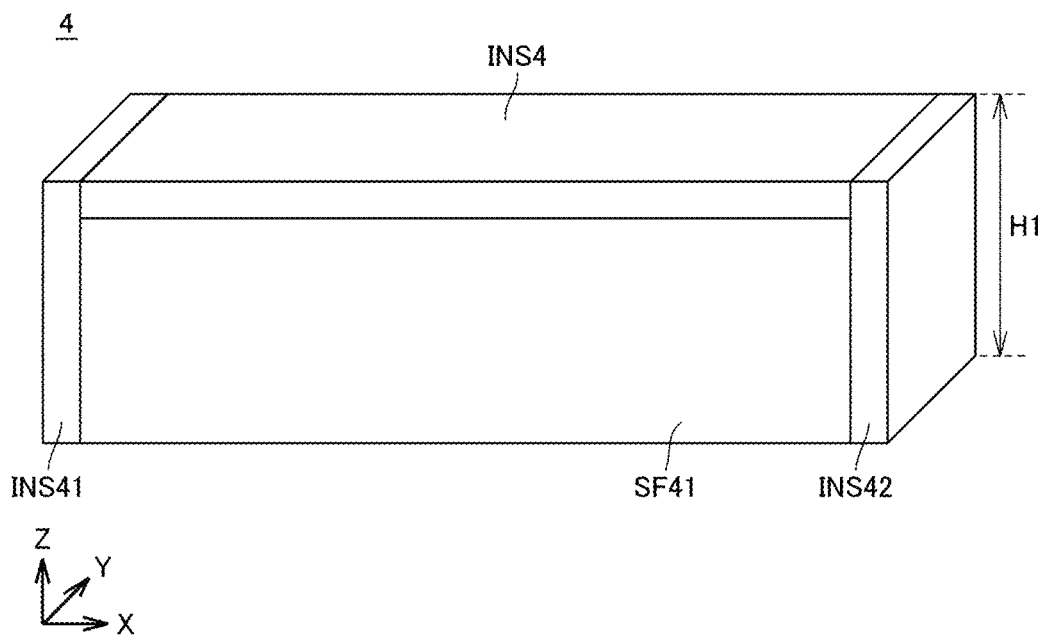
FIG. 11 is an external perspective view of an LC resonator according to a fourth preferred embodiment of the present invention.
Figure 12:
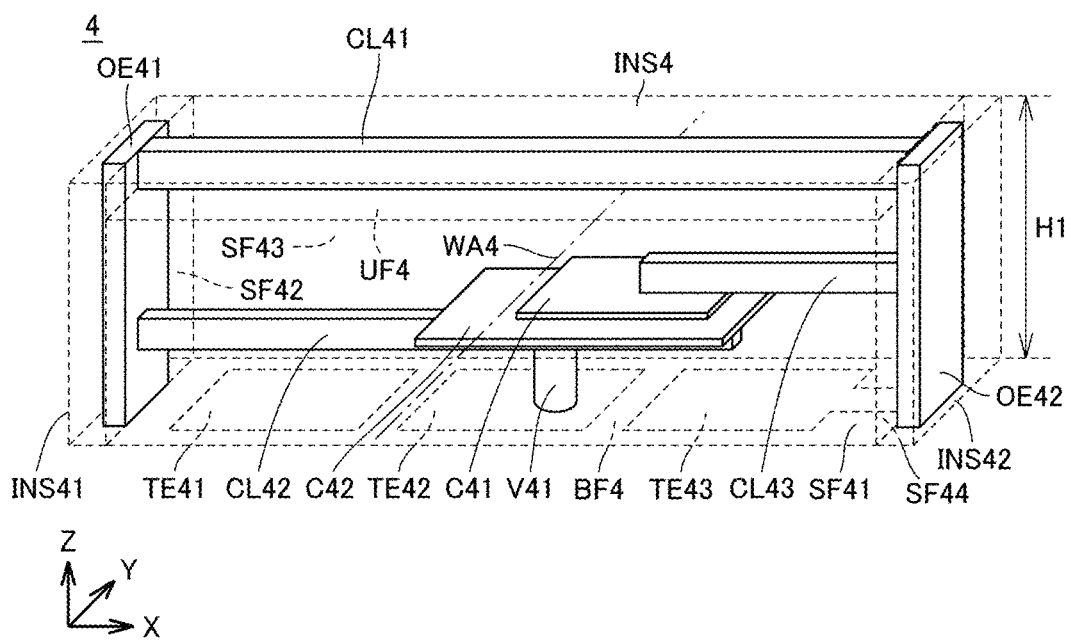
FIG. 12 is an external transparent perspective view of the LC resonator in FIG. 11.

FIG. 11 is an external perspective view of an LC resonator 4 according to the fourth preferred embodiment. FIG. 12 is an external transparent perspective view of the LC resonator 4 in FIG. 11. The LC resonator 4 includes a multilayer body in which multiple dielectric layers are laminated in the Z-axis direction (the laminated direction).

As illustrated in FIG. 11 and FIG. 12, the LC resonator is preferably, for example, a rectangular or substantially rectangular parallelepiped. Surfaces of the outermost layer, which are perpendicular or substantially perpendicular to the laminated direction of the multiple dielectric layers, are referred to as a bottom surface BF4 and an upper surface UF4. Among the surfaces parallel or substantially parallel to the laminated direction of the multiple dielectric layers, surfaces parallel or substantially parallel to the Z-X plane are referred to as side surfaces SF41 and SF43. Among the surfaces parallel or substantially parallel to the laminated direction of the multiple dielectric layers, surfaces parallel or substantially parallel to the Y-Z plane are referred to as side surfaces SF42 and SF44. The width (the thickness) in the laminated direction of the LC resonator 4 is denoted by H1.

Terminal electrodes TE41 to TE43 are provided on the bottom surface BF4. The terminal electrodes TE41 to TE43 are preferably, for example, land grid array (LGA) terminals on which plane electrodes are regularly or uniformly arranged. In the fourth preferred embodiment, the terminal electrodes TE42 and TE43 correspond to the external connection terminals P1 and P2, respectively, in FIG. 1. An insulating layer INS41 containing resin is provided on the side surface SF42. An insulating layer INS42 containing resin is provided on the side surface SF44. An insulating layer INS4 containing resin is provided on the upper surface UF4.

As illustrated in FIG. 12, columnar conductor patterns CL41, CL42, and CL43 having quadrangular or substantially quadrangular prism shapes, a cylindrical via conductor pattern V41, and plate-shaped capacitor conductor patterns C41 and C42 are provided inside the multiple dielectric layers.

The columnar conductor pattern CL41 is provided on the upper surface UF4 outside the multiple dielectric layers. The columnar conductor pattern CL41 extends in the X-axis direction. The columnar conductor patterns CL42 and CL43 extend in the X-axis direction inside the multiple dielectric layers. In a plan view from the X-axis direction, both of the length in the Y-axis direction of the columnar conductor pattern CL41 and the length in the Z-axis direction thereof are denoted by D1. The columnar conductor pattern CL41 is a prism having a square or substantially square cross-sectional shape. The same applies to the columnar conductor patterns CL42 and CL43.

The via conductor patterns V41 extends in the Z-axis direction and the columnar conductor pattern CL42 is connected to the terminal electrode TE42 with the via conductor patterns V41. The via conductor patterns V41 is a cylinder having a cross-sectional shape of the diameter D1.

The area of the columnar conductor pattern CL41 in a plan view from the X-axis direction is greater than the area of the via conductor patterns V41 in a plan view from the Z-axis direction. The same applies to the columnar conductor patterns CL42 and CL43.

An outer electrode OE41 is provided on the side surface SF42 outside the multiple dielectric layers. The outer electrode OE41 extends in the Z-axis direction and the columnar conductor patterns CL41 and CL42 are connected to each other with the outer electrode OE41.

An exposed portion of the outer electrode OE41 is covered with the insulating layer INS41. The insulating layer INS41 prevents the outer electrode OE41 from being in contact with conductors outside the multiple dielectric layers.

An outer electrode OE42 is provided on the side surface SF44 outside the multiple dielectric layers. The outer electrode OE42 extends in the Z-axis direction and the columnar conductor patterns CL41 and CL43 are connected to each other with the outer electrode OE42. The outer electrode OE42 is connected to the terminal electrode TE43.

An exposed portion of the outer electrode OE42 is covered with the insulating layer INS42. The insulating layer INS42 prevents the outer electrode OE42 from being in contact with conductors outside the multiple dielectric layers.

The capacitor conductor pattern C41 is connected to the columnar conductor pattern CL43. The capacitor conductor pattern C42 is connected to the columnar conductor pattern CL42. The capacitor conductor patterns C41 and C42 are opposed to each other in the Z-axis direction to define the capacitor C1.

The columnar conductor pattern CL43, the outer electrode OE42, the columnar conductor pattern CL41, the outer electrode OE41, and the columnar conductor pattern CL42 wind around an axis WA4 to define the inductor L1.

In the fourth preferred embodiment, providing the columnar conductor pattern CL41 on the upper surface UF4 outside the multiple dielectric layers enables the distance between the columnar conductor patterns CL41 and CL42 to be longer than the distance between the columnar conductor patterns CL31 and CL32 of the third preferred embodiment illustrated in FIG. 10. The loop length of the inductor L1 is capable of being made longer than that in the third preferred embodiment and the area of the cavity portion of the inductor L1 is capable of being further increased. As a result, the inductance of the inductor L1 is capable of being greater than that in the third preferred embodiment.

As described above, with the LC resonator according to the fourth preferred embodiment, it is possible to reduce or prevent the reduction of the Q value associated with the low profile, as in the first preferred embodiment.

In addition, in the fourth preferred embodiment, providing the columnar conductor patterns included in the inductor outside the multiple dielectric layers enables the area of the cavity portion of the inductor to be much greater than that in the third preferred embodiment. As a result, it is possible to further increase the inductance of the inductor.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An LC resonator comprising:
   a plurality of dielectric layers laminated in a lamination direction;
   an external connection terminal;
   an inductor winding around an axis orthogonal or substantially orthogonal to the laminated direction;
   a capacitor connected to the inductor; and
   a via conductor pattern extending in the laminated direction from the inductor and with which the inductor is connected to the external connection terminal; wherein
   the inductor includes a first columnar conductor pattern extending in a first direction orthogonal or substantially orthogonal to the lamination direction; and
   an area of the first columnar conductor pattern in a plan view from the first direction is greater than or equal to an area of the via conductor pattern in a plan view from the lamination direction.

2. The LC resonator according to claim 1, wherein
   at least a portion of the first columnar conductor pattern is exposed from a surface of the plurality of dielectric layers, which is orthogonal or substantially orthogonal to the laminated direction; and
   the LC resonator further includes an insulating portion with which the portion exposed from the plurality of dielectric layers of the first columnar conductor pattern is covered.

3. The LC resonator according to claim 2, wherein the first columnar conductor pattern is provided on the surface of the plurality of dielectric layers outside the plurality of dielectric layers.

4. The LC resonator according to claim 1, wherein, in a plan view from the first direction, a ratio of a second length of the first columnar conductor pattern in the lamination direction to a first length of the first columnar conductor pattern in a second direction orthogonal or substantially orthogonal to both of the lamination direction and the first direction is about one or more.

5. The LC resonator according to claim 4, wherein
   at least a portion of the first columnar conductor pattern is exposed from a surface of the plurality of dielectric layers, which is orthogonal or substantially orthogonal to the laminated direction; and
   the LC resonator further includes an insulating portion with which the portion exposed from the plurality of dielectric layers of the first columnar conductor pattern is covered.

6. The LC resonator according to claim 5, wherein the first columnar conductor pattern is provided on the surface of the plurality of dielectric layers outside the plurality of dielectric layers.

7. The LC resonator according to claim 4, wherein
   the inductor includes:
   a second columnar conductor pattern extending in the first direction;
   a first connection conductor extending in the lamination direction and with which the first columnar conductor pattern is connected to the second columnar conductor pattern; and a second connection conductor extending in the lamination direction and with which the first columnar conductor pattern is connected to the capacitor;

the first columnar conductor pattern, the first connection conductor, and the second columnar conductor pattern wind around the axis orthogonal or substantially orthogonal to the laminated direction;

the second columnar conductor pattern is connected to the second connection conductor via the capacitor; and the second columnar conductor pattern is connected to the external connection terminal with the via conductor pattern.

8. The LC resonator according to claim 7, wherein in a plan view from the first direction, a ratio of a fourth length of the second columnar conductor pattern in the lamination direction to a third length of the second columnar conductor pattern in the second direction is about one or more; and an area of the second columnar conductor pattern in a plan view from the first direction is greater than or equal to the area of the via conductor pattern in a plan view from the lamination direction.

9. The LC resonator according to claim 8, wherein at least a portion of the first connection conductor is exposed from a first side surface of the plurality of dielectric layers along the lamination direction; and the LC resonator further includes a first side surface insulating portion with which the portion exposed from the plurality of dielectric layers of the first connection conductor is covered.

10. The LC resonator according to claim 9, wherein the first connection conductor is provided on the first side surface outside the plurality of dielectric layers.

11. The LC resonator according to claim 10, wherein at least a portion of the second connection conductor is exposed from a second side surface of the plurality of dielectric layers, which is parallel or substantially parallel to the first side surface; and the LC resonator further includes a second side surface insulating portion with which the portion exposed from the plurality of dielectric layers of the second connection conductor is covered.

12. The LC resonator according to claim 11, wherein the second connection conductor is provided on the second side surface outside the plurality of dielectrics.

13. The LC resonator according to claim 9, wherein at least a portion of the second connection conductor is exposed from a second side surface of the plurality of dielectric layers, which is parallel or substantially parallel to the first side surface; and the LC resonator further includes a second side surface insulating portion with which the portion exposed from the plurality of dielectric layers of the second connection conductor is covered.

14. The LC resonator according to claim 13, wherein the second connection conductor is provided on the second side surface outside the plurality of dielectrics.

15. The LC resonator according to claim 7, wherein at least a portion of the first connection conductor is exposed from a first side surface of the plurality of dielectric layers along the lamination direction; and the LC resonator further includes a first side surface insulating portion with which the portion exposed from the plurality of dielectric layers of the first connection conductor is covered.

16. The LC resonator according to claim 15, wherein the first connection conductor is provided on the first side surface outside the plurality of dielectric layers.

17. The LC resonator according to claim 16, wherein at least a portion of the second connection conductor is exposed from a second side surface of the plurality of dielectric layers, which is parallel or substantially parallel to the first side surface; and the LC resonator further includes a second side surface insulating portion with which the portion exposed from the plurality of dielectric layers of the second connection conductor is covered.

18. The LC resonator according to claim 17, wherein the second connection conductor is provided on the second side surface outside the plurality of dielectrics.

19. The LC resonator according to claim 15, wherein at least a portion of the second connection conductor is exposed from a second side surface of the plurality of dielectric layers, which is parallel or substantially parallel to the first side surface; and the LC resonator further includes a second side surface insulating portion with which the portion exposed from the plurality of dielectric layers of the second connection conductor is covered.

20. The LC resonator according to claim 19, wherein the second connection conductor is provided on the second side surface outside the plurality of dielectrics.

* * * * *